(12) United States Patent
Matsuda et al.

(10) Patent No.: US 7,691,783 B2
(45) Date of Patent: Apr. 6, 2010

(54) TRANSFER SUBSTRATE, METHOD FOR FABRICATING DISPLAY DEVICE, AND DISPLAY DEVICE

(75) Inventors: Eisuke Matsuda, Kanagawa (JP); Masao Nishiguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 851 days.

(21) Appl. No.: 11/380,032

(22) Filed: Apr. 25, 2006

(65) Prior Publication Data
US 2006/0246240 A1    Nov. 2, 2006

(30) Foreign Application Priority Data
Apr. 27, 2005    (JP)    ............... P2005-128909

(51) Int. Cl.
*B41M 5/035*    (2006.01)
*B41M 5/46*    (2006.01)
*B41M 5/50*    (2006.01)

(52) U.S. Cl. ............ 503/227; 428/32.81; 430/945
(58) Field of Classification Search ............... None
See application file for complete search history.

(56) References Cited

FOREIGN PATENT DOCUMENTS

| JP | 2918037 | 1/2000 |
|----|---------|--------|
| JP | 3175733 | 3/2000 |

*Primary Examiner*—Bruce H Hess
(74) *Attorney, Agent, or Firm*—Sonnenschein Nath & Rosenthal LLP (57) ABSTRACT

A transfer substrate includes a support base which transmits laser light with a predetermined wavelength, a photothermal conversion layer provided on the support base, and a transfer layer provided on the photothermal conversion layer, the transfer layer including at least a luminescent layer. The photothermal conversion layer is composed of a first material and a second material having different absorptances with respect to the laser light.

23 Claims, 5 Drawing Sheets

TRANSFER SUBSTRATE, METHOD FOR FABRICATING DISPLAY DEVICE, AND DISPLAY DEVICE

CROSS REFERENCES TO RELATED APPLICATIONS

The present invention contains subject matter related to Japanese Patent Application JP 2005-128909 filed in the Japanese Patent Office on Apr. 27, 2005, the entire contents of which are incorporated herein by reference.

BACKGROUND OF THE INVENTION

1. Field of the Invention

The present invention relates to a luminescent material transfer substrate for transferring a transfer layer including at least a luminescent layer by sublimation to a target object, a method for fabricating a display device using the transfer substrate, and a display device fabricated using the transfer substrate. More particularly, the invention relates to a method for fabricating a display device that includes organic electroluminescent elements and a display device that includes organic electroluminescent elements.

2. Description of the Related Art

Organic EL elements using electroluminescence (hereinafter referred to as "EL") of organic materials have been receiving attention as light-emitting elements capable of achieving high-luminance light emission at low-voltage DC drive.

In full color organic EL display devices including organic EL elements, one of the important factors is to selectively disposing the individual luminescent organic materials as fine patterns on electrodes.

In order to fabricate a full color organic EL display device, since luminescent elements each emitting light of red (R), green (G), or blue (B) are arrayed on a substrate, organic layers each including at least a luminescent layer of any of these colors are formed. As one of the methods for fabricating such luminescent elements, a transfer method (i.e., thermal transfer method) using an energy source (heat source) has been proposed.

In the thermal transfer method, a thin film layer to be transferred is formed by vapor deposition, spin coating, printing, or the like on a transfer substrate, and after the thin film layer is attached to a substrate on which film formation is to be performed, energy such as laser light or heat is applied from the transfer substrate side. Subsequently, an organic layer on the transfer substrate is separated with the thin film layer being left partially or entirely, and thus the organic layer formed on the transfer substrate is transferred onto the substrate.

The advantage of the thermal transfer method is that patterning is not particularly required when a transfer layer is formed on a transfer substrate, and an organic layer is merely formed on the entire surface of the transfer substrate.

Only a portion irradiated with the heat source during transfer is transferred from the transfer substrate to the device-forming substrate. Thus, a high-definition pattern can be formed.

As the heat source used in the thermal transfer method, a laser is preferably used from the standpoint that high energy can be supplied locally. Furthermore, when scanning is performed with a laser beam having a reduced diameter, it is possible to form a line pattern very accurately, and higher definition is enabled.

In this method, however, it is necessary to sequentially scan a substrate with a laser beam while performing alignment with high accuracy, and thus it is difficult to improve productivity. In order to perform transfer while maintaining high productivity, it is desirable to design a structure in which laser irradiation can be performed on the entire surface of the transfer substrate or in which the desired transfer layer can be selectively transferred.

In consideration of the above, for example, Japanese Patent Nos. 2918037 and 3175733 each disclose a method in which a member having low thermal conductivity and a member having high thermal conductivity represented by copper (Cu) are patterned in advance onto a transfer substrate, and a desired organic layer is transferred using a laser, a heat bar, or the like as the heat source.

SUMMARY OF THE INVENTION

However, in the method in which heat is directly applied to the transfer layer through the member having high thermal conductivity, the amount of thermal energy required is very large, and damage to the organic layer to be transferred is very high. Consequently, it is not practical to employ the method described above when an organic EL element which has excellent characteristics suitable for practical use is fabricated using an organic EL material that is extremely sensitive to heat.

It is desirable to provide a transfer substrate which can be used to efficiently fabricate a display device including a luminescent material, such as an organic EL element, using a transfer process, and to provide a display device fabricated using the transfer substrate.

According to an embodiment of the present invention, a transfer substrate includes a support base which transmits laser light with a predetermined wavelength, a photothermal conversion layer provided on the support base, and a transfer layer provided on the photothermal conversion layer, the transfer layer including at least a luminescent layer, wherein the photothermal conversion layer is composed of a first material and a second material having different absorptances with respect to the laser light.

The first material forms a high-absorption region that absorbs the laser light and generates heat required for sublimation of the transfer layer, and the second material forms a low-absorption region that reflects and blocks the laser light so as not to generate heat required for sublimation of the transfer layer.

In such a transfer substrate, when laser light is applied to the transfer substrate, the laser light is absorbed by the high-absorption region and reflected by or transmitted through the low-absorption region. Consequently, the transfer layer including the luminescent layer is sublimated only in the high-absorption region that has absorbed the laser light, and thus selective transfer can be performed.

According to another embodiment of the present invention, a method for fabricating a display device includes the steps of placing a transfer substrate so as to face a device-forming substrate, the transfer substrate being prepared by forming a transfer layer including at least a luminescent layer on a support base provided with a photothermal conversion layer composed of a first material and a second material having different absorptances with respect to laser light, and selectively transferring a portion of the transfer layer corresponding to the first material having higher absorptance onto the device-forming substrate by irradiating the transfer substrate with laser light.

In such a fabrication method, the device-forming substrate onto which the transfer layer is to be transferred and the transfer substrate on which the transfer layer has been formed are positioned so as to face each other, and the transfer substrate is irradiated with laser light. Thus, one of the two materials of the photothermal conversion layer which has been formed on the transfer substrate in advance, i.e., the first material having higher absorptance, can absorb the laser light and apply heat partially to the transfer layer. Consequently, the transfer layer can be selectively sublimated only in a portion corresponding to the high-absorption region and transferred onto the device-forming substrate.

Furthermore, the difference in absorptance with respect to laser light between the two materials constituting the photothermal conversion layer provided on the transfer substrate is used in the step of transferring the transfer layer. Thus, even if laser light is applied to the entire surface of the transfer layer, it is possible to selectively transfer a portion of the transfer layer onto the device-forming substrate correspondingly to the high-absorption region.

In a display device fabricated using the transfer substrate or the fabrication method described above, it is possible to produce a fine light-emitting element with high accuracy by selective sublimation of the transfer layer.

DESCRIPTION OF THE PREFERRED EMBODIMENTS

Figure 1:
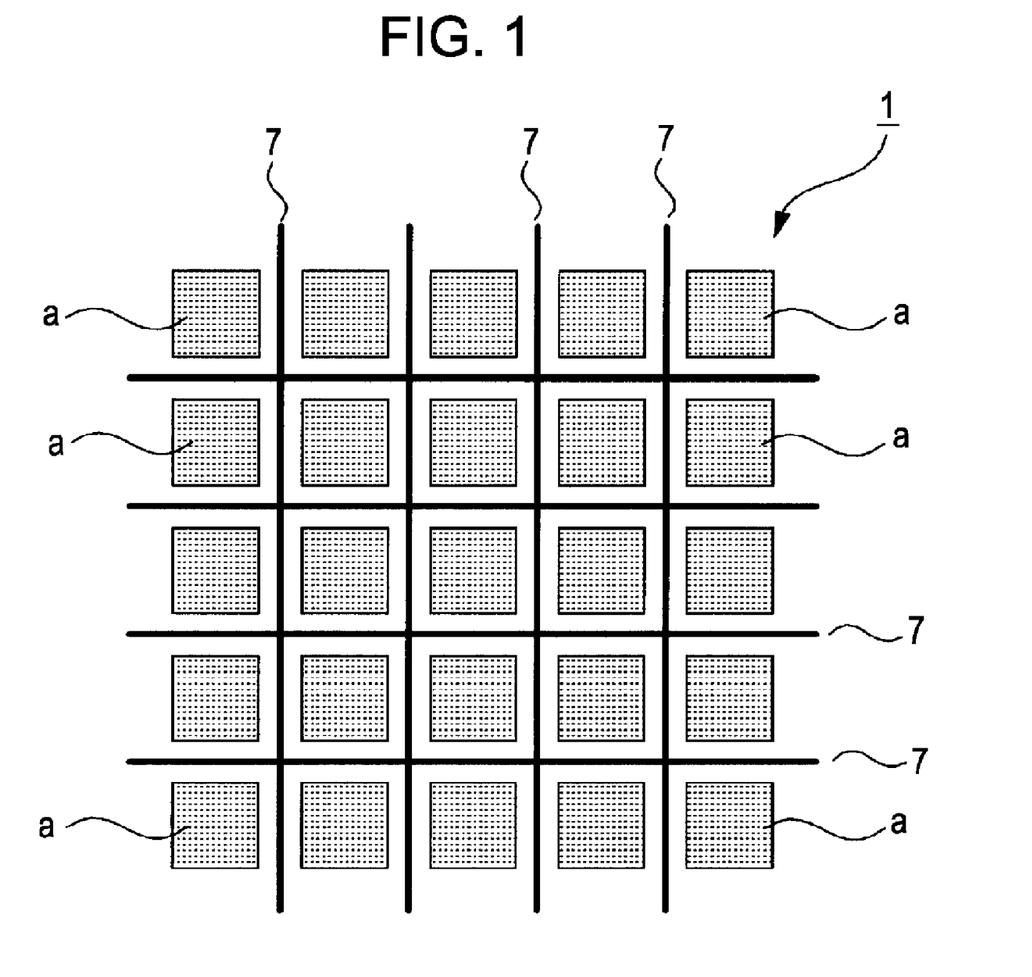
FIG. 1 is a schematic plan view of a display device according to an embodiment of the present invention.
Figure 2:
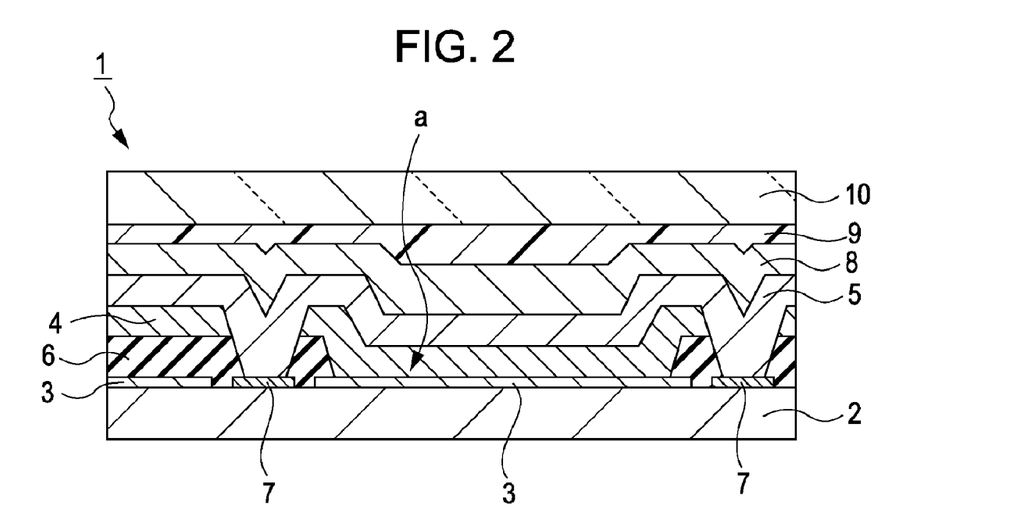
FIG. 2 is a schematic cross-sectional view of an organic EL element.

Embodiments of the present invention will be described below with reference to the drawings. FIG. 1 is a schematic view of a display device according to an embodiment of the present invention. An organic EL element 1 is provided correspondingly to each pixel a. As shown in FIG. 2 which is a schematic cross-sectional view, the organic EL element 1 includes a lower electrode 3, a functional layer 4, and an upper common electrode 5 provided in that order on a substrate 2. Furthermore, a protective film 8 is provided over the upper common electrode 5, and a glass substrate 10 is attached thereto through an UV curable resin 9.

Furthermore, when an auxiliary wiring 7 is provided between the pixels a, the functional layer 4 above the auxiliary wiring 7 is removed so that the upper common electrode 5 and the auxiliary wiring 7 are brought into contact and connected with each other. By applying a voltage to the upper common electrode 5 using the auxiliary wiring 7, it is possible to suppress the voltage drop and in-plane variation in voltage distribution in the upper common electrode 5, and to maintain the luminescent luminance of the organic EL element 1 in each pixel a.

Figure 6:
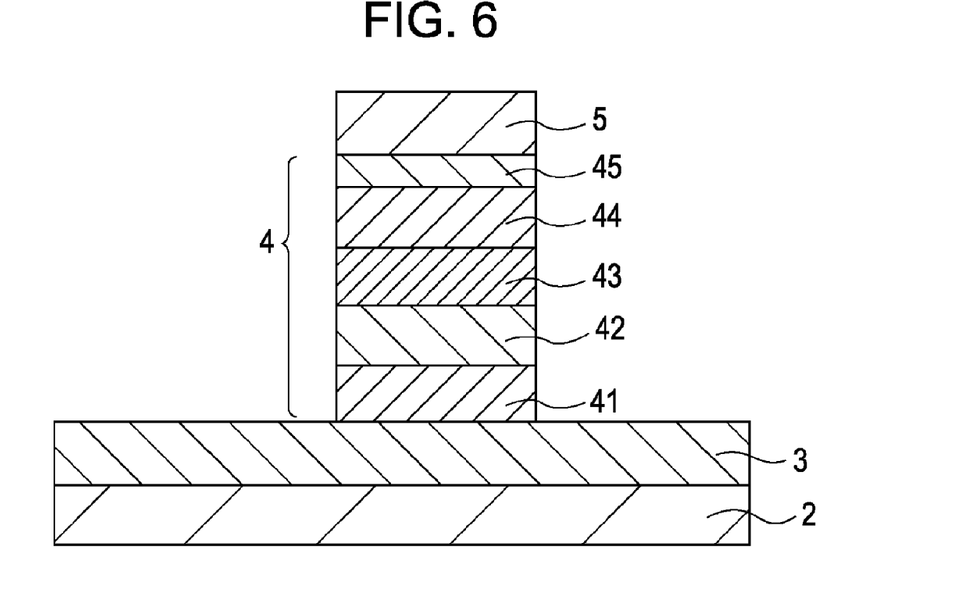
FIG. 6 is a schematic cross-sectional view illustrating a structure of a functional layer.

The functional layer 4 used in the organic EL element 1 includes, as shown in FIG. 6 which is a schematic cross-sectional view, a hole injection layer 41, a hole transport layer 42, a luminescent layer 43, an electron transport layer 44, and an electron injection layer 45 provided in that order on the lower electrode 3.

Figure 3:
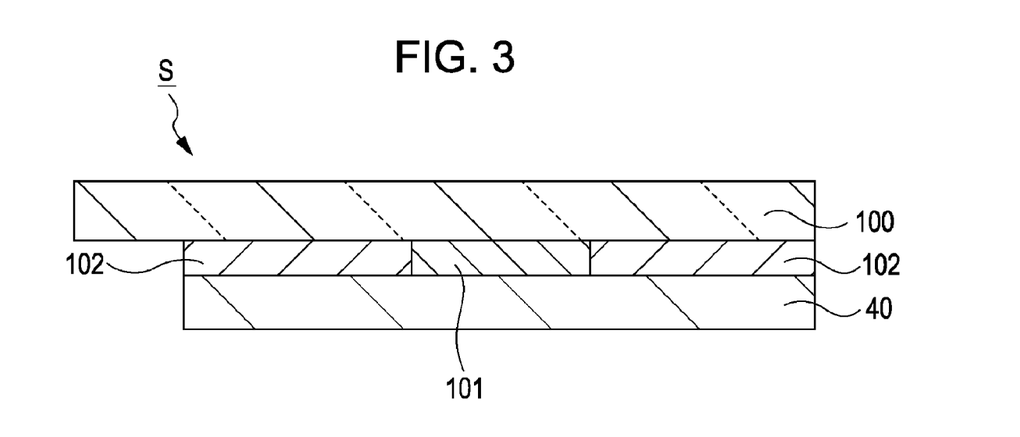
FIG. 3 is a schematic cross-sectional view of a transfer substrate according to the embodiment of the present invention.

According to this embodiment of the present invention, a transfer substrate is used in a transfer process for forming at least the luminescent layer 43 out of the layers constituting the functional layer 4. FIG. 3 is a schematic cross-sectional view of a transfer substrate according to the embodiment of the present invention. A transfer substrate S includes a support base 100 which transmits laser light with a predetermined wavelength, a transfer layer 40 provided on the support base 100, and two types of regions provided on the support base 100 and having different absorptances with respect to laser light (i.e., a low-reflection layer 101 and a high-reflection layer 102).

The low-reflection layer 101 absorbs laser light and generates heat required for sublimation of the transfer layer 40 and corresponds to a high-absorption region that can efficiently absorb laser light. The high-reflection layer 102 reflects and blocks laser light so as not to generate heat required for sublimation of the transfer layer 40 and corresponds to a low-absorption region that does not substantially absorb laser light. Hereinafter, description will be made on the assumption that the high-absorption region corresponds to the low-reflection layer 101 and the low-absorption region corresponds to the high-reflection layer 102. In the example shown in FIG. 3, the low-reflection layer 101 and the high-reflection layer 102 are provided between the support base 100 and the transfer layer 40. Note that the low-reflection layer 101 and the high-reflection layer 102 may be provided on a surface of the support base 100 opposite to the surface on which the transfer layer 40 is provided.

As the support base 100, for example, a glass substrate or the like that satisfactorily transmits laser light with a wavelength of 800 to 1,000 nm is used. By using a glass substrate, alignment with a device-forming substrate can be performed reliably, and when the transfer layer 40 remaining after sublimation is reused, handling is facilitated. In order to form the low-reflection layer 101 and the high-reflection layer 102 on the support base 100, patterning may be performed using ordinary photolithography.

The materials for the low-reflection layer 101 and the high-reflection layer 102 are chosen so that a satisfactory selection ratio is obtained between the materials such that when the same amount of laser light is applied to these layers, the low-reflection layer 101 causes sublimation of the transfer layer 40 and the high-reflection layer 102 does not cause sublimation of the transfer layer 40.

Figure 4:
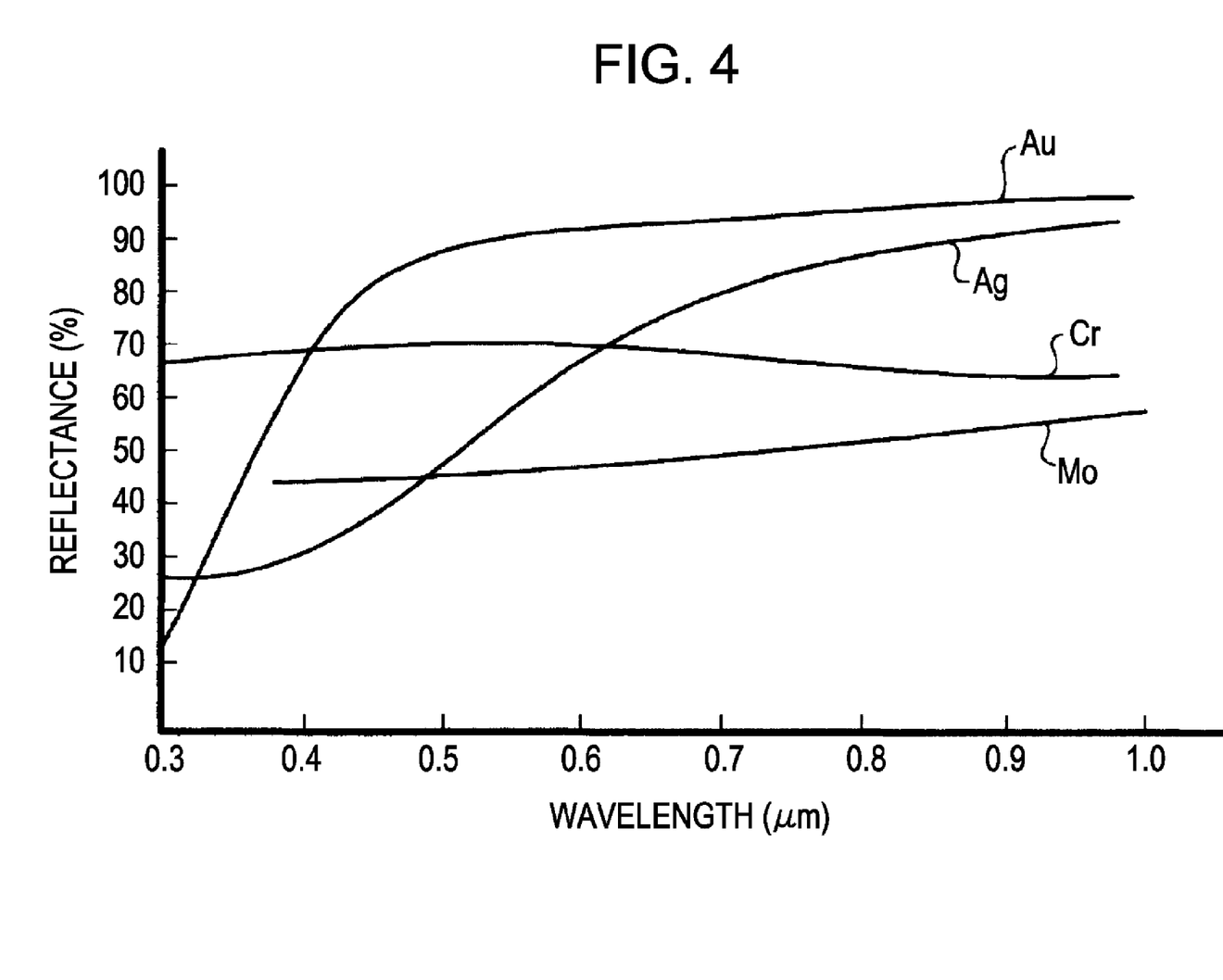
FIG. 4 is a graph showing an example of relationship between wavelength and reflectance.

FIG. 4 is a graph showing an example of relationship between wavelength and reflectance. In the laser light with a wavelength of 800 nm (0.8 µm) to 1,000 nm (1.0 µm) which is used in the embodiment of the present invention, Cr and Mo have low reflectance and Au and Ag have high reflectance. The difference in reflectance between the low-reflection layer 101 and the high-reflection layer 102 is preferably 20% to 50%. With such a difference in reflectance, when the same amount of laser light is applied, a selection ratio can be obtained such that the low-reflection layer 101 causes sublimation of the transfer layer 40 and the high-reflection layer 102 does not cause sublimation of the transfer layer 40.

Consequently, in this embodiment, as the low-reflection layer 101, a material selected from metals, such as molybdenum (Mo) and chromium (Co), and alloys containing these metals is used. As the high-reflection layer 102, a material selected from metals, such as gold (Au), silver (Ag), copper (Cu), and aluminum (Al), and alloys containing these metals (e.g., APC: Ag—Pd—Cu alloy) is used.

The low-reflection layer 101 and the high-reflection layer 102 may be each composed of a metal. Alternatively, they may be each composed of carbon or a resin as long as a satisfactory selection ratio is obtained because of the difference in reflectance and the materials themselves are not sublimated by irradiation of laser light.

When the low-reflection layer 101 and the high-reflection layer 102 are each composed of a metal, a difference in thermal conduction may occur depending on the materials. However, in this embodiment of the present invention, since the low-reflection layer 101 and the high-reflection layer 102 are each formed with an extremely small thickness, the influence of thermal conduction does not occur. The thickness of each of the low-reflection layer 101 and the high-reflection layer 102 is larger than the thickness at which the transmittance of laser light is substantially zero and is a thickness at which patterning can be easily performed and the influence of thermal diffusion does not occur, and the thickness is preferably 100 to 200 nm, and more preferably about 100 nm.

In the transfer substrate S according to the embodiment of the present invention, it is necessary to form the low-reflection layer 101 and the high-reflection layer 102 without openings between the layers so that leakage of laser light does not occur even if the entire surface is irradiated with the laser light. Furthermore, since the transfer layer 40 is formed on the support base 100 with the low-reflection layer 101 and the high-reflection layer 102 therebetween, preferably, the low-reflection layer 101 and the high-reflection layer 102 are formed at substantially the same thickness. Thereby, the transfer layer 40 can be formed uniformly (evenly), and transfer can be performed with high accuracy.

Figure 7:
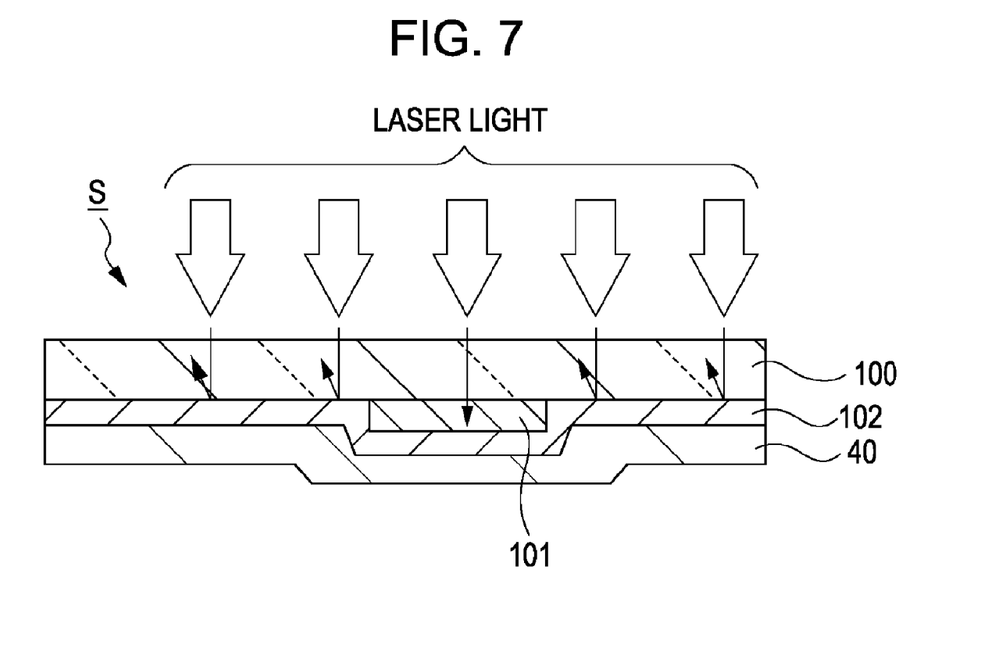
FIG. 7 is a schematic cross-sectional view of another example of a transfer substrate.

As shown in FIG. 7 which is a schematic cross-sectional view, a transfer substrate S may be produced by performing patterning of a low-reflection layer 101 only for a portion to be transferred, and then forming a high-reflection layer 102 entirely thereon. In such a case, since the high-reflection layer 102 covers the low-reflection layer 101, a step occurs in the transfer layer 40 at the portion to be transferred. However, since the step is extremely small at about 100 nm and the thickness of the transfer layer 40 is 100 nm or less, such a step is negligible in the production. In such a structure, the transfer substrate S can be produced by patterning of the low-reflection layer 101 only, and thus the production process can be greatly simplified.

A method for fabricating a display device using the transfer substrate S according to the embodiment of the present invention will now be described. First, as shown in FIG. 2, a lower electrode 3 is formed on a substrate 2. The lower electrode 3 is used as an anode or a cathode. When the display device is of a top emission type, the lower electrode 3 is composed of a highly reflective material. On the other hand, when the display device is of a transmissive type, the lower electrode 3 is formed to be transparent.

In this example, the display device is of a top emission type, and the lower electrode 3 is used as an anode. In such a case, the lower electrode 3 is composed of an electrically conductive material having high reflectance, such as silver (Ag), aluminum (Al), chromium (Cr), iron (Fe), cobalt (Co), nickel (Ni), copper (Cu), tantalum (Ta), tungsten (W), platinum (Pt), gold (Au), or an alloy thereof.

When the display device is of a top emission type and the lower electrode 3 is used as a cathode, the lower electrode 3 is composed of an electrically conductive material having a small work function. Examples of such an electrically conductive material which may be used include alloys of an active metal, such as lithium (Li), magnesium (Mg), or calcium (Ca), and a metal, such as silver (Ag), aluminum (Al), or indium (In), and laminates of these metals. Furthermore, a structure may be employed in which a layer composed of a compound of an active metal, such as Li, Mg, or Ca, and a halogen, such as fluorine or bromine, oxygen or the like is interposed between the lower electrode 3 and the functional layer 4.

Furthermore, when the display device is of a transmissive type and the lower electrode 3 is used as an anode, the lower electrode 3 is composed of an electrically conductive material having high transmittance, such as Indium-Tin-Oxide (ITO) or Indium-Zinc-Oxide (IZO). When the display device is of a transmissive type and the lower electrode 3 is used as a cathode, the lower electrode 3 is composed of an electrically conductive material having a small work function and high transmittance.

Subsequently, an insulating film 6 is formed so as to cover the peripheral portion of the lower electrode 3, and the lower electrode 3 is exposed from a window formed in the insulating film 6. Thus, a pixel region is formed. The insulating film 6 is, for example, composed of an organic insulating material, such as a polyimide or a photoresist, or an inorganic insulating material, such as silicon oxide.

Subsequently, a functional layer 4 is formed on the lower electrode 3 in each pixel a sequentially. The functional layer 4 is formed so as to completely cover the exposed surface of the lower electrode 3. In this example, as shown in FIG. 6, a hole injection layer 41, a hole transport layer 42, and a luminescent layer 43, and as necessary, an electron transport layer 44, and an electron injection layer 45 are deposited in that order on the lower electrode 3.

A specific example of the functional layer 4 will be described below. In this example, layers (common layers) other than the luminescent layer 43 are solidly formed, and in each element, an independent luminescent layer 43 is formed by laser thermal transfer using any of three colors: red (R), green (G), or blue (B). Of course, the present invention is also effective with respect to a device in which common layers are provided in a discrete form, a method in which common layers are also formed by laser thermal transfer according to the embodiment of the present invention, and a tandem organic EL element in which units (luminescent units) of a functional layer including a luminescent layer 43 are stacked. The term "luminescent unit" refers to a component constituting a known organic EL element excluding an anode and a cathode, i.e., a single luminescent layer or a plurality of layers including a luminescent layer, an electron injection layer, an electron transport layer, a hole injection layer, a hole transport layer, etc., and is a unit for generating light corresponding to a single color or multiple colors.

First, as a hole injection layer, m-MTDATA [4,4,4-tris(3-methylphenylphenylamino)triphenylamine] is vapor-deposited at a thickness of 25 nm with respect to all the pixels for R, G, and B. Subsequently, as a hole transport layer, α-NPD[4,4-bis(N-1-naphthyl-N-phenylamino)biphenyl] is vapor-deposited at a thickness of 30 nm. The material is not limited thereto, and for example, a hole transport material, such as a benzidine derivative, a styrylamine derivative, a triphenylmethane derivative, or a hydrazone derivative, may be used.

Furthermore, the individual organic layers, for example, the hole injection layer and the hole transport layer, each may have a layered structure including a plurality of layers.

Figure 5:
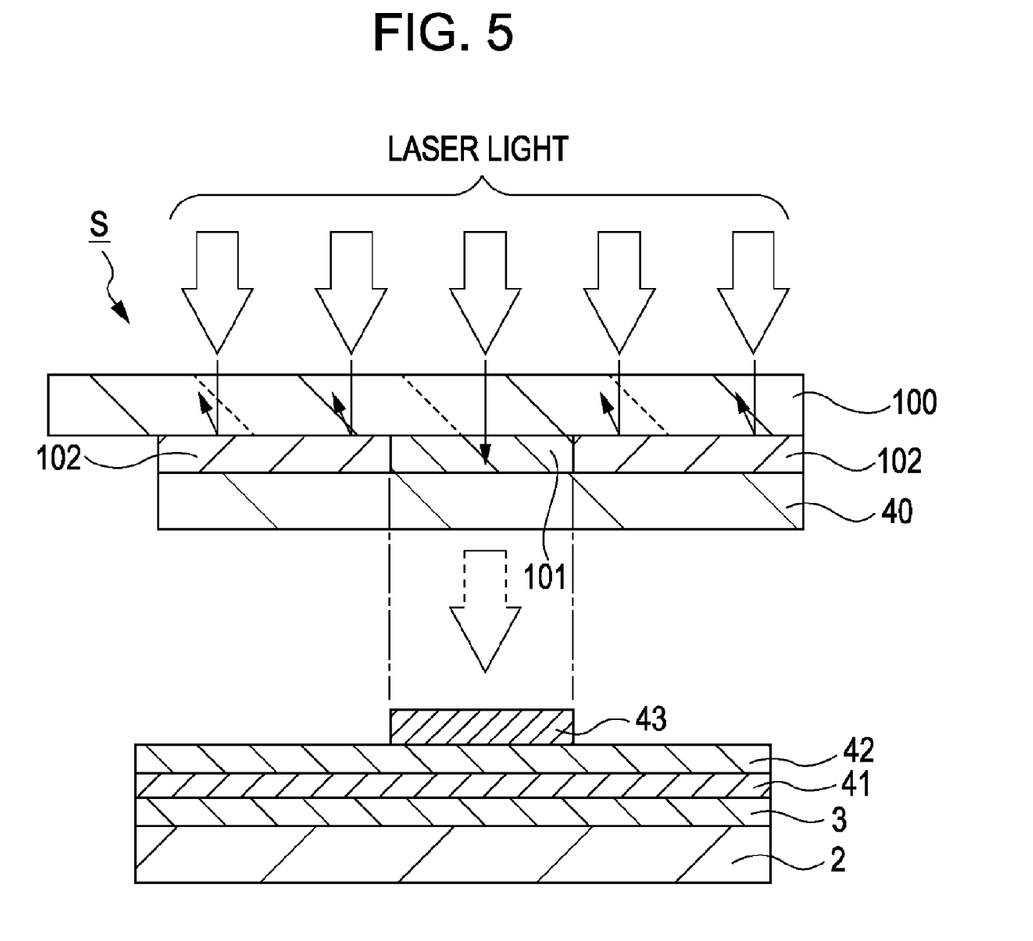
FIG. 5 is a schematic cross-sectional view illustrating a transfer step in a method for fabricating a display device according to the embodiment of the present invention.

Subsequently, as shown in FIG. 3, a low-reflection layer 101 corresponding to a transfer region is formed using Mo and a high-reflection layer 102 corresponding to a non-transfer region is formed using APC (Ag—Pd—Cu), each at a thickness of 200 nm and by patterning using ordinary lithography on a support base 100 composed of glass. A transfer layer (luminescent material) 40 is formed thereon, and a transfer substrate S is thereby prepared. Subsequently, as shown in FIG. 5, a luminescent layer 43 is formed at a thickness of 25 nm using the luminescent material transfer substrate S.

With respect to continuous-wave (CW) laser light of 800 nm used for transfer in this example, the difference in reflectance between APC and Mo is 40% or more, which is sufficient for selective transfer. Examples of the material which may be used for the high-reflection layer 102 include Ag, Al, Cu, and alloys thereof, and examples of the material which may be used for the low-reflection layer 101 include Mo, Cr, and alloys thereof. However, the materials are not limited thereto, and the materials are chosen so as to produce a difference in reflectance that enables selective transfer.

Furthermore, in this embodiment of the present invention, as shown in FIG. 1, in order to perform color display using a structure in which a plurality of pixels a arrayed in a matrix on a substrate emit light of R, G, and B, different light-emitting organic compounds are used for luminescent layers for R, G, and B. That is, at least three transfer substrates S are required.

A red luminescent layer includes, for example, a red luminescent material, and at least one of a hole transport material, an electron transport material, and a hole and electron transport material. The red luminescent material may be fluorescent or phosphorescent. In this embodiment, for example, the red luminescent layer has a thickness of about 30 nm and is composed of a material prepared by mixing 30% by weight of 2,6-bis[(4'-methoxydiphenylamino)styryl]-1,5-dicyanonaphthalene (BSN) with ADN.

A green luminescent layer includes, for example, a green luminescent material, and at least one of a hole transport material, an electron transport material, and a hole and electron transport material. The green luminescent material may be fluorescent or phosphorescent. In this embodiment, for example, the green luminescent layer has a thickness of about 30 nm and is composed of a material prepared by mixing 5% by weight of coumarin 6 with ADN.

A blue luminescent layer includes, for example, a blue luminescent material, and at least one of a hole transport material, an electron transport material, and a hole and electron transport material. The blue luminescent material may be fluorescent or phosphorescent. In this embodiment, for example, the blue luminescent layer has a thickness of about 30 nm and is composed of a material prepared by mixing 2.5% by weight of 4,4'-bis[2-{4-(N,N-diphenylamino)phenyl}vinyl]biphenyl (DPAVBi) with ADN.

In the thermal transfer process using laser light, first, the substrate 2 on which layers up to the hole transport layer 42 have been deposited is positioned in a transfer relationship with the transfer substrate S according to this embodiment on which the transfer layer 40 has been deposited. Both substrates are in close contact with each other. However, since the insulating film 6 for isolating pixels is thicker than the transfer layer 40 which has been deposited, the organic layers are only in close proximity to each other but not in close contact with each other. In this step, preferably, a vacuum environment is produced. Thereby, adhesion between the substrates is increased, and pattern accuracy in transfer is improved.

Subsequently, for example, infrared laser light of 800 nm is applied toward the transfer substrate S so as to be absorbed by the light absorption region composed of the low-reflection layer 101, and using heat generated therefrom, the transfer layer 40 including the luminescent layer 43 is transferred onto the hole transport layer 42 which has been deposited on the substrate 2.

In this embodiment, the low-reflection layer 101 and the high-reflection layer 102 are formed without openings on the transfer substrate S. Therefore, for example, even if the entire surface of the transfer substrate S is irradiated with laser light, the laser light can be reflected by the region other than the low-reflection layer 101 which is formed correspondingly to the portion to be transferred and the laser light is absorbed only by the low-reflection layer 101. As a result, a portion of the transfer layer 40 corresponding thereto only can be sublimated. Consequently, highly accurate transfer can be accomplished by a simple device configuration without providing a complex driving member for a laser head or an alignment mechanism.

The thermal transfer described above is performed repeatedly using different transfer substrates S for RGB three colors. Preferably, the whole process is carried out in a vacuum. Thereby, degradation of the device can be prevented and adhesion between the substrates can be improved.

Although the transfer process of the transfer layer using laser light irradiation can be performed in an atmospheric pressure, thermal transfer in a vacuum is preferred. By carrying out thermal separation in a vacuum, laser separation can be performed with lower energy, and an adverse thermal effect on adjacent pixels can be reduced. Moreover, it is possible to prevent the occurrence of incomplete separation, thus reducing the probability of the occurrence of contact failure.

After the transfer layers including the RGB luminescent layers are transferred as described above, an electron transport layer 44 is solidly formed over the entire surface of the display area. The electron transport layer 44 has a thickness of 20 nm and is composed of 8-hydroxyquinoline aluminum (Alq3). Subsequently, LiF is vacuum vapor deposited as an electron injection layer 45 at a thickness of about 0.3 nm (vapor deposition rate: 0.01 nm/sec), and then MgAg is vacuum vapor deposited as an upper common electrode 5 at a thickness of 10 nm.

The upper common electrode 5 is used as an anode or a cathode. When the display device is of a top emission type, the upper common electrode 5 is formed to be transparent or translucent. On the other hand, when the display device is of a transmissive type, the upper common electrode 5 is composed of a highly reflective material. In this step, the upper common electrode 5 is formed by a deposition method in which energy of particles deposited is small to such an extent that does not adversely affect the underlayer, for example, by a vapor deposition method or a chemical vapor deposition (CVD) method.

Preferably, the upper common electrode 5 is continuously formed in the same apparatus as that used for forming the functional layer 4 without exposing the functional layer 4 to the air. Thereby, the functional layer 4 is prevented from being degraded by the moisture in the air.

In this example, since the display device is of a top emission type and the lower electrode 3 is used as an anode, the upper common electrode 5 is used as a cathode. In such a case, the upper common electrode 5 is formed to be transparent using a material having a small work function so that electrons can be effectively injected into the functional layer 4. In particular, the upper common electrode 5 is preferably formed as a metal thin film by a deposition method in which energy of particles deposited is small, such as a vapor deposition method.

Furthermore, when the display device is of a transmissive type and the upper common electrode 5 is used as a cathode, the upper common electrode 5 is composed of an electrically conductive material having a small work function and high reflectance. When the display device is of a transmissive type and the upper common electrode 5 is used as an anode, the upper common electrode 5 is composed of an electrically conductive material having high reflectance.

Subsequent to the steps described above, as shown in FIG. 2, a protective film 8 which is insulating or electrically conductive is provided over the transparent upper common electrode 5 composed of a metal thin film. In this step, the protective film 8 is formed by a deposition method in which energy of particles deposited is small to such an extent that does not adversely affect the underlayer, for example, by a vapor deposition method or a chemical vapor deposition (CVD) method. Furthermore, the protective film 8 is continuously formed in the same apparatus as that used for the formation of the upper common electrode 5 without exposing the upper common electrode 5 to the air. Thereby, the functional layer 4 is prevented from being degraded by the moisture and oxygen in the air.

Furthermore, the protective film 8 is formed with a sufficient thickness using a material having low water permeability and low water absorption in order to prevent moisture from reaching the functional layer 4. When the display device is of a top emission type, the protective film 8 is composed of a material that transmits light generated in the functional layer 4, and for example, a transmittance of about 80% is ensured.

In particular, in this example, the protective film 8 is composed of an insulating material. That is, the insulating protective film 8 is directly formed on the single-layered upper common electrode 5 composed of a metal thin film.

Examples of the material that can be preferably used for the protective film 8 include inorganic amorphous, insulating materials, such as amorphous silicon ($\alpha$-Si), amorphous silicon carbide ($\alpha$-SiC), amorphous silicon nitride ($\alpha$-Si$_{1-x}$N$_x$), and amorphous carbon ($\alpha$-C). Since such inorganic amorphous, insulating materials do not form grains, they have low water permeability, and thus can form a satisfactory protective film 8.

For example, when amorphous silicon nitride is used, the protective film 8 is formed at a thickness of 2 to 3 µm by a CVD method. In such a case, in order to prevent the functional layer 4 from being degraded to decrease luminance, preferably, deposition is performed at normal temperature. Furthermore, in order to prevent the protective film 8 from being delaminated, preferably, the deposition conditions are set such that the stress on the film is minimized.

When the protective film 8 is composed of an electrically conductive material, a transparent electrically conductive material, such as ITO or IXO, is used.

Subsequent to the formation of the protective film 8, as shown in FIG. 2, a glass substrate 10 is fixed on the protective film 8, as necessary, with an UV curable resin 9 therebetween. Thereby, the display device is completed.

In the display device thus fabricated, use of the transfer substrate S according to the embodiment of the present invention enables fine pattern formation of the transfer layer 40 by selective sublimation of the luminescent material of the transfer layer 40. Thus, highly accurate display devices can be efficiently produced in large quantities.

In the fabrication method described above, the transfer layer including the luminescent layer is thermally transferred using the transfer substrate S according to the embodiment of the present invention. It may be possible to perform thermal transfer using the transfer substrate S according to the embodiment of the present invention when any of the organic layers other than the luminescent layer is formed.

In the embodiment described above, the high-reflection layer 102 has been explained as an example of the low-absorption region that does not substantially absorb laser light in the photothermal conversion layer. However, it may be possible to use, as the low-absorption layer, a transparent layer that transmits laser light, i.e., that does not substantially absorb laser light not by reflection but by transmission.

It should be understood by those skilled in the art that various modifications, combinations, sub-combinations and alterations may occur depending on design requirements and other factors insofar as they are within the scope of the appended claims or the equivalents thereof.

What is claimed is:

1. A transfer substrate comprising:
   a support base which transmits laser light with a predetermined wavelength;
   a photothermal conversion layer on the support base; and
   a transfer layer on the photothermal conversion layer, the transfer layer including at least a luminescent layer,
   wherein the photothermal conversion layer is composed of
     a first material providing a high-absorption region that absorbs the laser light and generates heat for sublimation of the transfer layer and a second material providing a low-absorption region that reflects or transmits the laser light so as not to generate heat for sublimation of the transfer layer, the high-absorption region having a face attached to the support base.

2. The transfer substrate according to claim 1, wherein the high-absorption region corresponds to a region to be transferred in the transfer layer.

3. The transfer substrate according to claim 2, wherein the low-absorption region covers a portion of the support base lacking the high-absorption region.

4. The transfer substrate according to claim 3, wherein the high-absorption region and the low-absorption region have substantially the same thickness.

5. The transfer substrate according to claim 2,
   wherein the low-absorption region covers the entire surface of the support base having the high-absorption region.

6. The transfer substrate according to claim 5, further comprising:
   a step formed in a portion of the photothermal conversion layer where the high-absorption region is covered with the low-absorption region,
   wherein a size of the step is about 100 nm.

7. The transfer substrate according to claim 1, wherein the first material and the second material is respectively composed of a metal, carbon, or a resin.

8. The transfer substrate according to claim 1, wherein the difference in reflectance between the first material and the second material is 20% to 50%.

9. The transfer substrate according to claim 1, wherein the low-absorption region transmits the laser light.

10. The transfer substrate according to claim 1, wherein the first material is made of molybdenum, chromium, or a mixture thereof.

11. The transfer substrate according to claim 1, wherein the second material is made of gold, silver, copper, aluminum, or a mixture thereof.

12. A method for fabricating a display device including at least a luminescent layer between an anode and a cathode, the method comprising the steps of:

placing a transfer substrate so as to face a device-forming substrate, the transfer substrate being prepared by forming a transfer layer including at least the luminescent layer on a support base provided with a photothermal conversion layer composed of a first material providing a high-absorption region that absorbs the laser light and generates heat for sublimation of the transfer layer and a second material providing a low-absorption region that reflects or transmits the laser light so as not to generate heat for the sublimation of the transfer layer, the high-absorption region having a face attached to the support base; and selectively transferring a portion of the transfer layer corresponding to the first material having higher absorptance onto the device-forming substrate by irradiating the transfer substrate with laser light.

13. The method for fabricating the display device according to claim 12, wherein the first material and the second material are formed by patterning on the support base in advance.

14. The method for fabricating the display device according to claim 12, wherein the first material and the second material each are composed of a metal, carbon, or a resin.

15. The method for fabricating the display device according to claim 12, wherein, in the step of transferring the portion of the transfer layer, the portion of the transfer layer is selectively transferred onto the device-forming substrate using the difference in absorptance with respect to the laser light between the first material and the second material provided on the transfer substrate to form a functional layer including the luminescent layer.

16. The method for fabricating the display device according to claim 12, wherein by irradiating the entire surface of the transfer substrate with the laser light, only the high-absorption region absorbs the laser light and generates heat, and thus only a portion of the transfer layer corresponding to the high-absorption region is thermally transferred.

17. The method for fabricating the display device according to claim 12, wherein after the transfer substrate is placed so as to face the device-forming substrate, laser light in an amount that can generate sufficient heat in the high-absorption region for transferring the transfer layer onto the device-forming substrate is applied to the transfer substrate to transfer at least a portion of the transfer layer, subsequently an organic layer containing an electron transport material is formed, and then the cathode is formed.

18. The method for fabricating the display device according to claim 12, wherein the step of transferring the portion of the transfer layer is repeated corresponding to the number of colors.

19. The method for fabricating the display device according to claim 12, wherein transfer layers including luminescent layers of respective colors for full-color displays are formed in advance on the transfer substrate, and using the transfer substrate, the transfer layers of a plurality of colors are transferred at one time to the device-forming substrate.

20. The transfer substrate according to claim 12, wherein the low-absorption region transmits the laser light.

21. The transfer substrate according to claim 12, wherein the first material is made of molybdenum, chromium, or a mixture thereof.

22. The transfer substrate according to claim 12, wherein the second material is made of gold, silver, copper, aluminum, or a mixture thereof.

23. The transfer substrate according to claim 12, wherein the transfer substrate is set apart from the device-forming substrate during the transferring step.

* * * * *